United States Patent [19]
Paell et al.

[11] Patent Number: 5,436,191
[45] Date of Patent: * Jul. 25, 1995

[54] QUANTUM WIRE FABRICATION VIA PHOTO INDUCED EVAPORATION ENHANCEMENT DURING IN SITU EPITAXIAL GROWTH

[75] Inventors: Thomas L. Paell, Los Altos, Calif.; John E. Epler, Zurich, Switzerland

[73] Assignee: Xerox Corporation, Stamford, Conn.

[ * ] Notice: The portion of the term of this patent subsequent to May 19, 2009 has been disclaimed.

[21] Appl. No.: 279,143

[22] Filed: Jul. 22, 1994

Related U.S. Application Data

[62] Division of Ser. No. 542,857, Jun. 25, 1990, Pat. No. 5,362,973.

[51] Int. Cl.⁶ .............................................. H01L 21/20
[52] U.S. Cl. ..................................... 437/110; 437/90; 437/129; 437/173
[58] Field of Search ................. 437/129, 110, 173, 90, 437/935, 936

[56] References Cited

U.S. PATENT DOCUMENTS

| | | | |
|---|---|---|---|
| 4,509,996 | 4/1985 | Greene et al. | 437/129 |
| 4,888,624 | 12/1989 | Johnston, Jr. et al. | 437/129 |
| 4,962,057 | 10/1990 | Epler et al. | 437/173 |
| 5,013,684 | 5/1991 | Epler et al. | 437/129 |
| 5,114,877 | 5/1992 | Paoli et al. | 437/129 |

OTHER PUBLICATIONS

J. E. Eplaer et al., "In situ patterned desorption of GaAs quantum wells for monolithic multiple wavelength diode lasers," Appl. Phys. Lett. 54 (10), 6 Mar. 1989, pp. 881–883.

Primary Examiner—R. Bruce Breneman
Assistant Examiner—Linda J. Fleck
Attorney, Agent, or Firm—William Propp

[57] ABSTRACT

In situ removal of selected or patterned portions of quantum well layers is accomplished by photo induced evaporation enhancement to form quantum wire, patterned quantum wire and multiple quantum wires in a semiconductor structure.

29 Claims, 4 Drawing Sheets

QUANTUM WIRE FABRICATION VIA PHOTO INDUCED EVAPORATION ENHANCEMENT DURING IN SITU EPITAXIAL GROWTH

The Government has certain rights in this invention pursuant to Contract No. 86F173100 awarded by the Defense Advanced Research Projects Agency (DARPA).

CROSS-REFERENCE TO RELATED APPLICATIONS

This is a division of U.S. application Ser. No. 07/542,857, filed Jun. 25, 1990, now U.S. Pat. No. 5,362,973. This application contains subject matter that is related to the subject matter of U.S. Pat. No. 4,962,09, granted Nov. 9, 1990; U.S. patent application Ser. No. 07/579,218, a file wrapper continuation of U.S. patent application Ser. No. 07/328,988, filed Mar. 24, 1989, now abandoned; U.S. patent application Ser. No. 07/581,398, a file wrapper continuation of U.S. patent application Ser. No. 07/328,275, filed Mar. 24, 1989, now abandoned; U.S. Pat. No. 5,013,684, granted May 7, 1991; U.S. Pat. No. 5,114,877, granted May 19, 1992; and U.S. Pat. No. 5,138,625, granted Aug. 11, 1992.

BACKGROUND OF THE INVENTION

The present invention relates generally to semiconductor structures and more particularly to semiconductor structures having quantum wires fabricated employing in situ photo induced modifications to compound semiconductor films during epitaxial growth.

The hallmark of the electronics industry has been miniaturization. The size required for computer chips and semiconductors has plunged nearly a thousandfold in just ten years. The future suggests even further progress in shrinking electronic elements.

One aspect of the semiconductor has not keep pace in this rush toward miniaturization, the wires carrying the electric current flow to and from the ever smaller lasers, p-n junctions, transistors, LEDs and other diodes, detectors, integrated circuits, microelectronics and the like. This may eventually lead to the rather incongruous sight of the wiring connecting circuitry components being larger than the components themselves.

Quantum wires in semiconductors are regions in which the charge carriers are quantum confined in the 2 dimensions orthogonal to the axis of the wire. Quantum effects in GaAs layers are most strong when the thickness is less than 50 nm. A quantum wire will still be useful if only one of its dimensions is less than 50 nm. For GaAs this typically means a region for the quantum wire in a semiconductor smaller than about 50 nm by 100 nm.

In addition to their current conductance, quantum wires are expected to have useful and novel electrical properties such as extremely high electron mobility due to the two dimensional confinement of carriers. Quantum wires of the appropriate size are expected to act like electron waveguides which are analogous to optical waveguides.

In situ fabrication of arrays of quantum wires has been contemplated and demonstrated by Fukui et al., "(AlAs)$_{0.5}$ (GaAs)$_{0.5}$ fractional-layer superlattices grown on (001) vicinal surfaces by metalorganic chemical vapor deposition" in *Appl. Phys. Letters* 50, 824 (1987) and Tsuchiya et al. in *Phys Rev Letters* 62, 466 (1989) using stepped surfaces obtained with off axis substrates to produce tilted superlattices. A difficulty with this approach is the propagation of this surface topography through the relatively thick layers required for the other layers of a semiconductor structure. Also, the resulting poor geometry of the quantum wires in the structure would make them ineffective as current carrying wires.

What is desired is a process, particularly as implemented in molecular beam epitaxy (MBE) or metalorganic chemical vapor deposition (MOCVD), wherein ultrafine patterning of conducting channels or wires or electron waveguides can be achieved in situ without growth interruption by some off-line or nongrowth procedure or process.

There are two examples known to us where patterning may be achieved by quasi-in situ thermal processing wherein thermal etching is employed to selectively remove GaAs. In one example, a n-GaAs layer over a p-AlGaAs layer is first, selectively chemically etched in a particular region followed by thermal etching to remove the remaining thin GaAs left from chemical etching before proceeding with regrowth of the p-AlGaAs layer. This forms a buried reverse biased current confinement mechanism in a double heterostructure laser. H. Tanaka et al, "Single-Longitudinal-Mode Self Aligned AlGa(As) Double-Heterostructure Lasers Fabricated by Molecular Beam Epitaxy", *Japanese Journal of Applied Physics*, Vol. 24, pp. L89-L90, 1985.

In the other example, a GaAs/AlGaAs heterostructure partially masked by a metallic film is thermally etched in an anisotropic manner illustrating submicron capabilities for device fabrication. A. C. Warren et al, "Masked, Anisotropic Thermal Etching and Regrowth for In Situ Patterning of Compound Semiconductors", *Applied Physics Letters*, Vol. 51(22), pp. 1818-1820, Nov. 30, 1987. In both of these examples, AlGaAs masking layers are recognized as an etch stop to provide for the desired geometric configuration in thermally etched GaAs, although it is also known that, given the proper desorption parameters, AlGaAs may also be thermally etched at higher temperatures with different attending ambient conditions visa vis GaAs.

However, none of these techniques employ in situ photo induced evaporation as a technique in a film deposition system to incrementally reduce, on a minute scale, film thickness in patterned or selective locations at the growth surface either during or after film growth, producing smooth sculptured surface morphology which is a principal objective of this invention.

It is an object of this invention to bring about in situ removal or desorption of selected surface regions or layers of compound semiconductors employing induced evaporation enhancement in metalorganic chemical vapor deposition (MOCVD) epitaxy and to apply this method in the fabrication of in situ fabricated quantum wire in a semiconductor structure.

It is another object of this invention to fabricate a quantum wire layer in a groove of a semiconductor structure and to eliminate the side regions of a deposited quantum well layer in the groove and adjust the lateral dimensions of the quantum well layer to form the quantum wire.

It is an object of this invention to fabricate patterned quantum wire and multiple quantum wire layers, both horizontally or vertically, or in a two-dimensional array of a semiconductor structure.

SUMMARY OF THE INVENTION

According to this invention, in situ removal or thinning of portions or all of selected regions of deposited films are brought about by a technique employing an irradiation energy source directed to a spot or region of exposure on the growth surface of a substrate or support in a deposition system, e.g., MBE or MOCVD system. This technique, termed "induced evaporation enhancement", is taught in U.S. patent application Ser. No. 07/257,498 filed Oct. 13, 1988.

In particular, the invention herein is directed to the employment of this technique in fabricating in situ quantum wires in semiconductor structures wherein induced evaporation enhancement purely removes or prevents the continued growth of the epitaxially deposited materials in selected regions at the growth surface without the need or introduction of masking or chemical etching processes.

Other objects and attainments together with a fuller understanding of the invention will become apparent and appreciated by referring to the following description and claims taken in conjunction with the accompanying drawings.

DESCRIPTION OF THE PREFERRED EMBODIMENTS

In describing the devices of this invention, reference is generally made to individual discrete structures although it is generally the case that a plurality of such devices would be fabricated on a wafer substrate in a MOCVD reactor wherein the processing laser beam would be scanned and/or modulated to selected locations to perform the desired induced evaporation enhancement in patterned fashion across the wafer surface.

Figure 1:
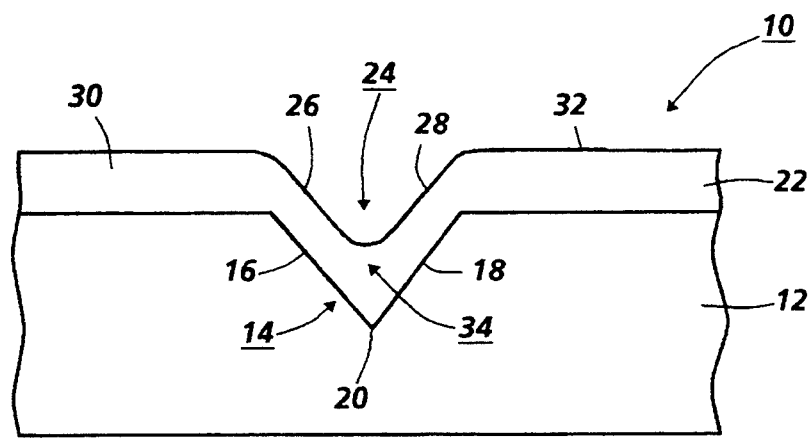
FIG. 1 is a schematic illustration of a side elevation of a quantum wire semiconductor structure prior to photo induced desorption formed according to this invention.

Reference is now made to FIG. 1 wherein there is disclosed a semiconductor structure 10 having a single quantum wire and fabricated using MOCVD processing as described in incorporated U.S. patent application Ser. No. 07/257,498. Semiconductor structure 10 includes a semiconductor cladding layer or substrate 12 of high bandgap semiconductor material such as $Al_xGa_{1-x}As$ upon which is formed a groove 14. If a semiconductor cladding layer is used, the layer can be anywhere in a semiconductor structure.

The groove can be fabricated in the cladding layer by chemical etching, reactive ion etching, ion milling or other means known to those of ordinary skill in the art. The groove can also be fabricated by a tightly focused beam scanned across the surface of the cladding layer with changing dwell time, a process described in incorporated U.S. patent application Ser. No. 07/257,498.

In general, the groove should be as narrow as possible. However, the width and depth of the groove will depend upon the process used to fabricate it. For example, chemical etching and beam desorption form grooves that are wider than their depth. It is desirable to form grooves which are deeper than their width with sidewall angles greater than 45 degrees. Reactive ion etching or ion milling form grooves with greater than 45 degrees sidewalls and even grooves with vertical sidewalls.

For the sake of illustration in this embodiment, the groove 14 is V-shaped with opposing angled sidewalls 16 and 18 culminating in vertex 20. The groove can be from 10 nm to 2.5 microns deep.

Upon the cladding layer 12, a quantum well layer 22 of low bandgap semiconductor material such as GaAs or $Al_zGa_{1-z}As$ where $z<x$ is grown at a temperature greater than 725° C. The quantum well layer is typically less than 30 nm thick. A groove 24 in the quantum well layer is formed in the groove 14 in the cladding layer. The growth rate on the sidewalls 26 and 28 of the groove 24 of the quantum well layer at this temperature is lower than on the horizontal top surfaces, or mesas, 30 and 32, allowing formation of a slightly thicker region 34 at the vertex of the quantum well groove as shown in FIG. 1.

Upon completion of the growth of quantum well layer 22, however, epitaxial growth is temporally discontinued, and as taught in U.S. patent application Ser. No. 07/257,498, the trimethyl-gallium (TMG) source to the MOCVD chamber is turned off, the substrate temperature is increased to about 825° C. and a laser beam or combination laser beam is focused on the surface of quantum well layer 22 either orthogonally or, as indicated by lines 36 in FIG. 2, at an angle near normal incidence to the sidewalls for a period of time sufficient to thermally evaporate quantum well layer 22 at sidewalls 26 and 28 to the sidewalls 16 and 18 of cladding layer 12 at a rate of 1 Å/second. The temperature at the illuminated portion of the quantum layer 22 during the evaporation process may be about 1000° C. to 1030° C.

It is well known in the art that at temperatures above about 725° C. the growth of GaAs on sidewalls of a mesa or groove is slower than on the mesa top or at the vertex of the groove and that the difference increases further as the temperature is increased. This behavior implies that the sticking coefficient for Ga and As atoms is smallest on the sidewalls. Hence for near normal incidence of the optical illumination increased temperature is expected to desorb the GaAs of quantum well layer 22 preferentially from the sidewalls 26 and 28 and the top mesa areas 30 and 32 of the quantum well layer 22 compared to the region 34 at the vertex 20 of the quantum well groove 24.

By controlling the illumination intensity, the angle and the length of exposure of the laser beam 36, the areas of quantum well layer 22 along the sidewalls 26 and 28 are desorbed down to the interface with cladding layer 12 resulting in a crescent shaped quantum wire 38 forming in the vertex 20 of the groove 14 of the cladding layer 12. The $Al_xGa_{1-x}As$ of the cladding layer 12 functions as a desorption stop to the optically induced desorption because $Al_xGa_{1-x}As$ where $x \geq 0.15$ is much more difficult to desorb according to this process as compared to the desorption of the GaAs of the quantum well layer 22.

In any case, the operating temperature for AlGaAs will be higher than that for GaAs because the Al content in AlGaAs causes a slower evaporation rate since GaAs has a higher vapor pressure than AlGaAs.

Figure 2:
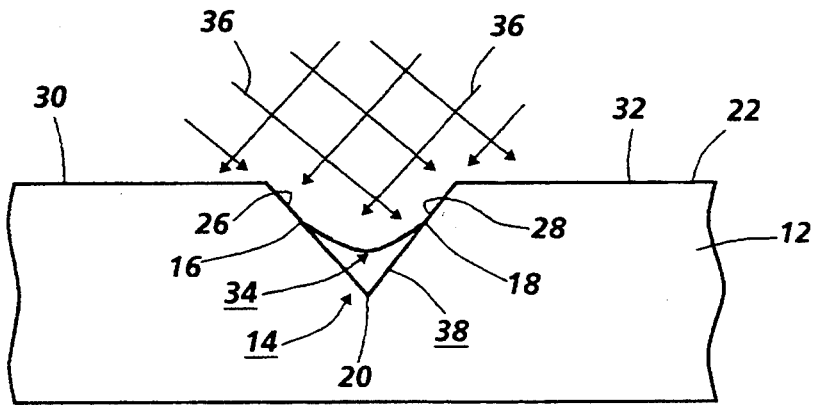
FIG. 2 is a schematic illustration of a side elevation of a quantum wire semiconductor structure during photo induced desorption formed according to this invention.

The incident angle of the laser beam 36 can also be adjusted to shadow the vertex and concentrate illumination on the sidewalls as shown in FIG. 2. The desorption of the quantum well layer in the shadowed vertex region will proceed more slowly than it would in the presence of illumination since any photochemical desorption will be reduced or eliminated and the vertex region will be cooler than its surrounding sidewalls. Both effects will enhance the lateral selectivity of the desorption. The optical process should be highly reproducible because exposure time and illumination intensity can be accurately controlled.

The method of U.S. patent application Ser. No. 07/257,498 allows growth of the quantum well layer to be performed at a temperature that optimizes the quality of the layer for the flow of electrical current. The desorption can subsequently be accomplished at a base temperature conducive to the preferential thinning of the sidewalls relative to the vertex region. The laser approach to the desorption is preferable to the simple raising of the temperature of the substrate to induce desorption because the intensity of the optical illumination allows for faster control of the semiconductor temperature, shorter desorption times and less time spent at high undesired temperatures. All of these factors greatly enhance the reproducibility of the process using optical illumination.

Figure 3:
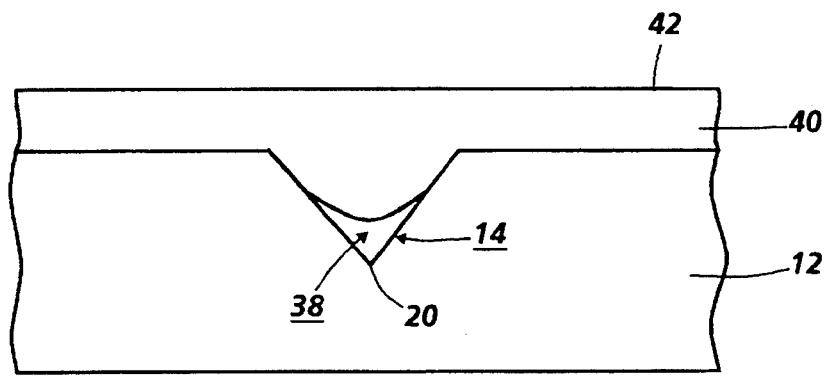
FIG. 3 is a schematic illustration of a side elevation of a quantum wire semiconductor structure formed according to this invention.

As shown in FIG. 3, after photo-induced desorption, a crescent shaped quantum wire 38 has formed in vertex 20 of the groove 14 of the cladding layer 12 with the quantum well layer no longer existing on the sidewalls of the groove or the mesa levels on top of the cladding layer. Epitaxial growth is then continued with the growth of a cladding layer 40 of high bandgap semiconductor material such as $Al_yGa_{1-y}As$ where $y > z$ and $x > z$, but y can be $>$ or $<$ x. The semiconductor cladding layer 40 can either follow the contour of the previously deposited cladding layer 12 with its groove 14 and crescent shaped quantum wire 38 or, as shown in this Figure, provide a flat upper surface 42. Other semiconductor layers can be deposited on cladding layer 40.

One alternative to having a lower bandgap material quantum wire between higher bandgap material cladding layers is to have the quantum wire of doped material and the cladding layers of undoped or semi-insulating material. The initial cladding layer 12 of FIGS. 1 to 3 would be a layer of undoped or $p$-$Al_xGa_{1-x}As$. The quantum well layer 22 of FIG. 1 would be a n-type doped quantum well layer comprising n-GaAs heavily doped, for example, with Si or Se at a concentration of $10^{19}/cm^3$. The quantum well layer would be desorbed down to form the quantum wire 38 of FIGS. 2 and 3 and a cladding layer 40 of undoped or $p$-$Al_xGa_{1-x}As$ would be grown on top of the quantum wire, as shown in FIG. 3.

The doping content of the quantum well layer is of opposing conductivity type to the adjacent undoped or semi-insulating cladding layers. Thus, the quantum wire and the cladding layers can be of the same material, for example AlGaAs, even though the bandgap would obviously be the same for both the wire and the cladding.

Figure 4:
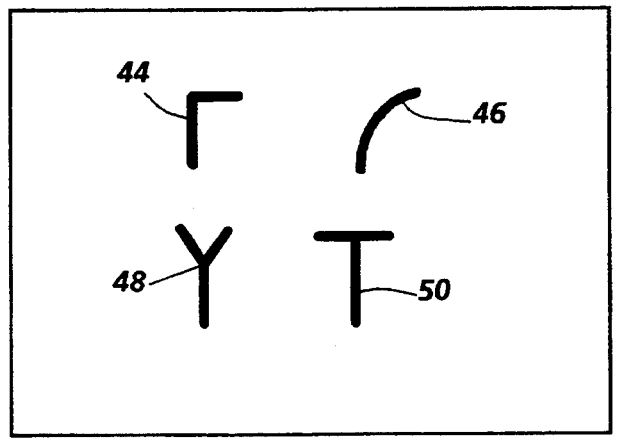
FIG. 4 is a schematic illustration of a top elevation of patterns of quantum wire semiconductor structure formed according to this invention.

By patterning the length and direction of the groove in the cladding layer as shown in FIG. 4, quantum wires can be formed at a right angle 44, a curve 46, a Y-branch 48, a T-branch 50 or any other pattern useful for the flow of electric current or electronic circuitry or electronic waveguides. Curves may require special etching techniques.

Figure 5:
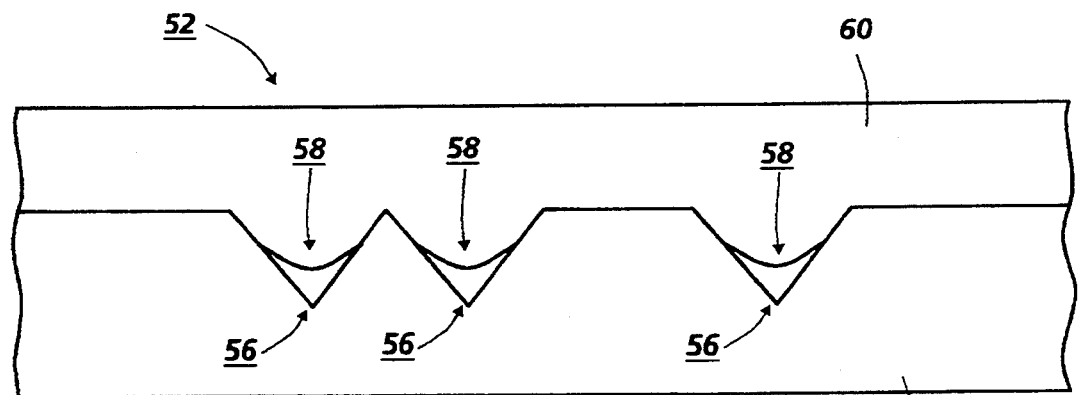
FIG. 5 is a schematic illustration of a side elevation of a series of linear or horizontal multiple quantum wire semiconductor structure formed according to this invention.

FIG. 5 discloses a semiconductor structure 52 with a series of linear or horizontal multiple quantum wires. The semiconductor structure 52 includes a semiconductor cladding layer or substrate 54 of GaAs or $Al_xGa_{1-x}As$, upon which multiple grooves 56 have been fabricated. Upon the cladding layer and grooves is epitaxially deposited a quantum well layer of GaAs or $Al_zGa_{1-z}As$ where $z < x$ which is desorbed down to crescent shaped quantum wires 58 in the vertices of the grooves by means previously taught in this application. The desorbing laser beam can either be a single laser beam or a combination beam working in sequence, or more appropriately, multiple laser beams or combination laser beams working in parallel or in series. A semiconductor cladding layer 60 of $Al_yGa_{1-y}As$ is epitaxially deposited on top of the exposed surfaces of the semiconductor layer 54, the grooves 56 and the quantum wires 58 also as previously taught in this application. It is not necessary that the grooves, and thus the quantum wires, be parallel. As discussed with regard to FIG. 4, patterns can be formed.

Figure 6:
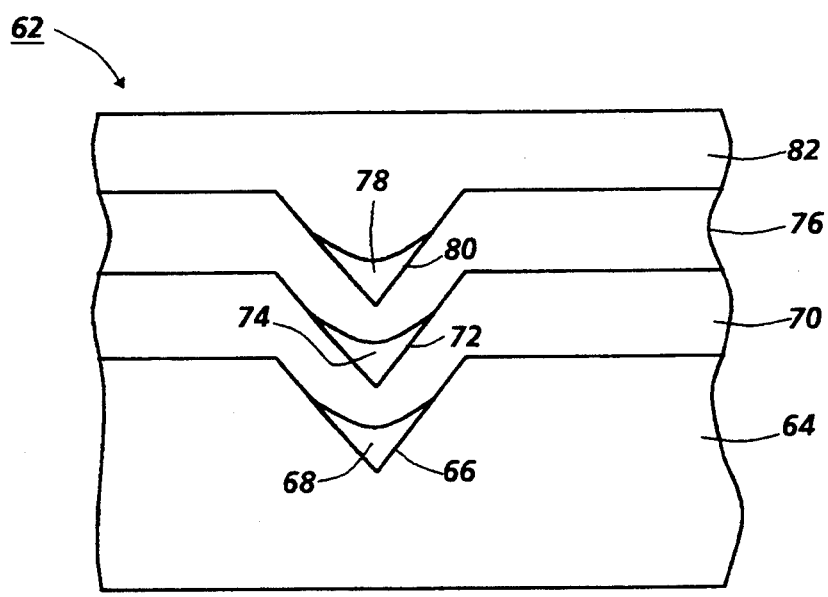
FIG. 6 is a schematic illustration of a side elevation of a vertical series of linear or horizontal quantum wire semiconductor structure formed according to this invention.

FIG. 6 discloses a semiconductor structure 62 with a vertical series of linear or horizontal quantum wires. The semiconductor structure 62 includes a semiconductor cladding layer or substrate 64 of GaAs or $Al_xGa_{1-x}As$, upon which a groove 66 has been fabricated. Upon the cladding layer and groove is epitaxially deposited a quantum well layer of GaAs or $Al_zGa_{1-z}As$ where $z < x$ which is desorbed down to a crescent shaped quantum wire 68 at the vertex of the groove by means previously taught in this application. A barrier layer 70 of high bandgap semiconductor material such as $Al_cGa_{1-c}As$ where $z < c$ is then epitaxially deposited over the exposed surfaces of the semiconductor layer 64, the groove 66 and the quantum wire 68. The barrier layer follows the contour of the previously deposited layer, groove and quantum wire to form a groove 72 in its surface, spatially aligned vertically with the groove 66 in the semiconductor layer 64.

Another quantum well layer is grown on top of the barrier layer 70 and photo induced desorbed by means previously taught in this application leaving a crescent shaped quantum wire 74 at the vertex of the groove 72.

Another barrier layer 76 is deposited, followed by a quantum well layer which is desorbed to leave a crescent shaped quantum wire 78 at the vertex of a groove 80.

Epitaxial growth is then continued with the growth of a semiconductor cladding layer 82 of $Al_yGa_{1-y}As$ which can either follow the contour of the previously deposited barrier layer 76 with its groove 80 and crescent shaped quantum wire 78 or, as shown in this Figure, provide a flat upper surface 84.

In this Figure, the barrier layer follows the contour of the previous cladding or barrier layer. Thus, since there is a groove in the cladding layer, an aligned groove will form in the barrier layer when the barrier layer is epitaxially deposited on top of the cladding layer.

If the barrier layer is grown with a flat upper surface, the groove in the barrier layer can also be fabricated by the same means as the groove in the cladding layer, namely by chemical etching, reactive ion etching, ion milling or other means known to those of ordinary skill in the art. The groove can also be fabricated by a tightly focused beam scanned across the surface of the cladding layer with changing dwell time, a process described in incorporated U.S. patent application Ser. No. 07/257,498.

One alternative to having the high bandgap semiconductor material barrier layer is to have the quantum wire of doped material and the cladding layers and barrier layers of undoped or semi-insulating material. The initial cladding layer 64 of FIG. 6 would be a layer of undoped or $P-Al_xGa_{1-x}As$. The quantum well layer and the resulting quantum wire 68 would be a n-type doped quantum well layer comprising n-GaAs heavily doped, for example, with Si or Se at a concentration of $10^{19}/cm^3$. The barrier layer 70 of undoped or $p-Al_xGa_{1-x}As$ would be grown on top of the quantum wire. The other barrier layers 70 and 76 and the semiconductor cladding layer 82 would also be undoped or $p-Al_xGa_{1-x}As$ and the other quantum wires 74 and 78 would be heavily doped n-GaAs.

The doping content of the quantum well layer is of opposing conductivity type to the adjacent undoped or semi-insulating cladding and barrier layers. Thus, the quantum wire and the cladding and barrier layers can be of the same material, for example AlGaAs, even though the bandgap would obviously be the same for both the wire and the cladding.

The sequentially grown quantum wires of FIG. 6 are all self-aligned by the formation of the grooves. This growth sequence of alternating barrier layers and quantum well layers to be desorbed into quantum wires in the vertex of a groove of the barrier layer can be repeated to form as many quantum wires and layers of quantum wires as desired to form a multi-line bus of quantum wires buried in the semiconductor.

Figure 7:
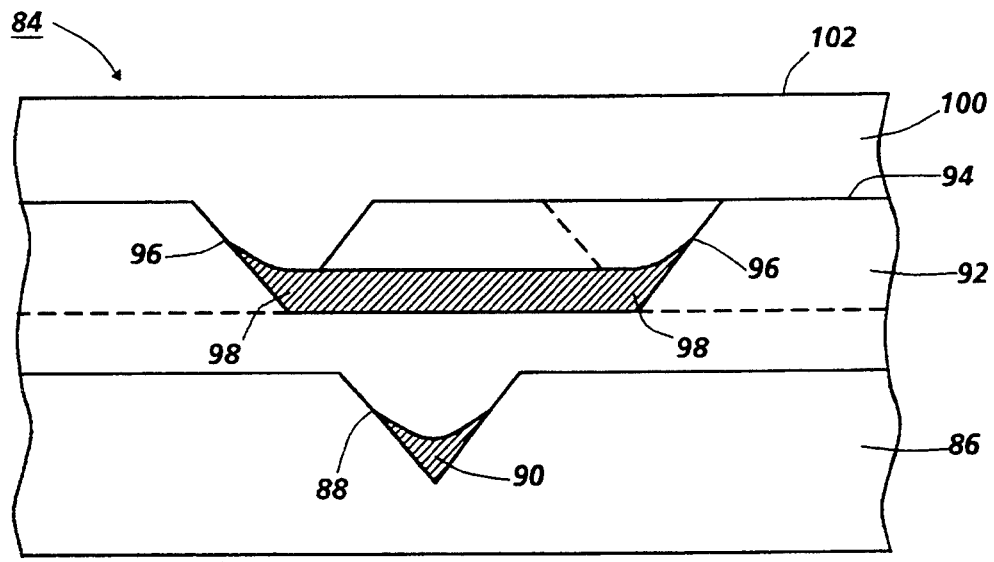
FIG. 7 is a schematic illustration of a side elevation of an alternative embodiment of a vertical series of linear or horizontal quantum wire semiconductor structure formed according to this invention.

Alternatively, as shown in FIG. 7, the quantum wires of a semiconductor structure need not be aligned, but can cross spatially separated by a barrier layer. The semiconductor structure 84 with multiple vertical quantum wires includes a semiconductor cladding layer or substrate 86 of GaAs or $Al_xGa_{1-x}As$, upon which a groove 88 has been fabricated by means previously discussed in this application. Upon the cladding layer and groove is epitaxially deposited a quantum well layer of GaAs or $Al_zGa_{1-z}As$ where $z<x$ which is desorbed down to a crescent shaped quantum wire 90 at the vertex of the groove by means previously taught in this application. A barrier layer 92 of $Al_cGa_{1-c}As$ where $z<c$ or any semi-insulating or low bandgap semiconductor material is then epitaxially deposited over the exposed surfaces of the semiconductor layer 86, the groove 88 and the quantum wire 90 to form a flat upper surface 94 to the barrier layer.

A groove 96 is fabricated in the barrier layer 92 by means previously taught in this application. The groove 96 in the barrier layer is not aligned with the groove 88 in the cladding layer. Spatially, the grooves can be at any angle relative to each other. For the purposes of this example, the groove 96 in the barrier layer is at right angles, orthogonal to the groove 88 in the cladding layer.

Another quantum well layer is grown on top of the barrier layer 92 and photo induced desorbed by means previously taught in this application leaving a crescent shaped quantum wire 98 at the vertex of the groove 96.

As shown in the Figure, it is not necessary that the quantum wires be parallel and the wires may cross spatially at any angle relative to each other, separated by the barrier layer. This growth sequence of alternating depositing barrier layers, forming grooves and depositing quantum well layers to be desorbed into quantum wires in the vertex of a groove of the barrier layer can be repeated to form as many quantum wires and layers of quantum wires and patterns of quantum wires as desired.

Epitaxial growth is then continued with the growth of a semiconductor cladding layer 100 of $Al_yGa_{1-y}As$ which can either follow the contour of the previously deposited barrier layer 92 with its groove 96 and crescent shaped quantum wire 98 or, as shown in this Figure, provide a flat upper surface 102.

Figure 8:
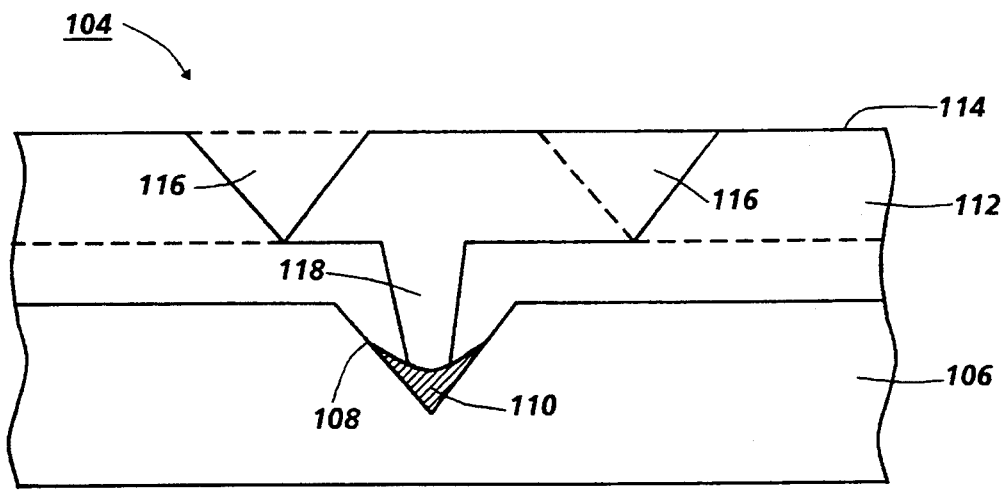
FIG. 8 is a schematic illustration of a cut-away side elevation of a vertical quantum wire semiconductor structure prior to photo induced desorption formed according to this invention.

FIG. 8 discloses a semiconductor structure 104 with a vertical quantum wire. Semiconductor structure 104 includes a semiconductor cladding layer or substrate 106 of GaAs or $Al_xGa_{1-x}As$, upon which a groove 108 has been fabricated by means previously discussed in this application. Upon the cladding layer and groove is epitaxially deposited a quantum well layer of GaAs or $Al_zGa_{1-z}As$ where $z<x$ which is desorbed down to a crescent shaped quantum wire 110 at the vertex of the groove by means previously taught in this application. A barrier layer 112 of $Al_cGa_{1-c}As$ where $z<c$ or any semi-insulating or low bandgap semiconductor material is then epitaxially deposited over the exposed surfaces of the semiconductor layer 106, the groove 108 and the quantum wire 110 to form a flat upper surface 114 to the barrier layer.

A groove 116 is fabricated in the barrier layer 112 by means previously taught in this application. The groove 116 in the barrier layer is spatially orthogonal to the groove 108 in the cladding layer. A hole 118 is fabricated vertically in the groove 116 through the barrier layer 112 to the buried quantum wire 110 in the groove 108 in the cladding layer 106. This connecting hole can be fabricated by the same means previously taught in this application as the grooves are fabricated. Similarly, the connecting hole can be a shallow or deep groove or a groove with vertical walls.

Figure 9:
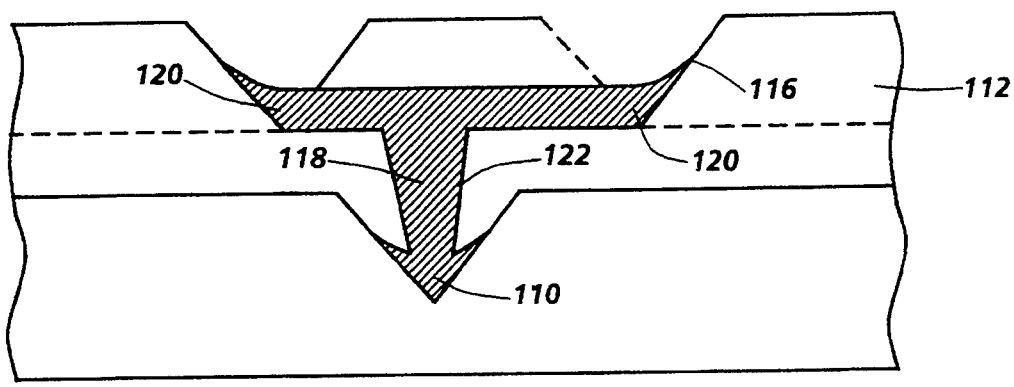
FIG. 9 is a schematic illustration of a cut-away side elevation of a vertical quantum wire semiconductor structure during photo induced desorption formed according to this invention.

Another quantum well layer is deposited on top of the barrier layer 112 to fill the groove 116 and the connecting hole 118 as shown in FIG. 9. The quantum well layer is photo induced desorbed by means previously taught in this application leaving a crescent shaped quantum wire 120 at the vertex of the groove 116 and a vertical quantum wire 122 in the hole 118 connecting quantum wire 120 and quantum wire 110.

Figure 10:
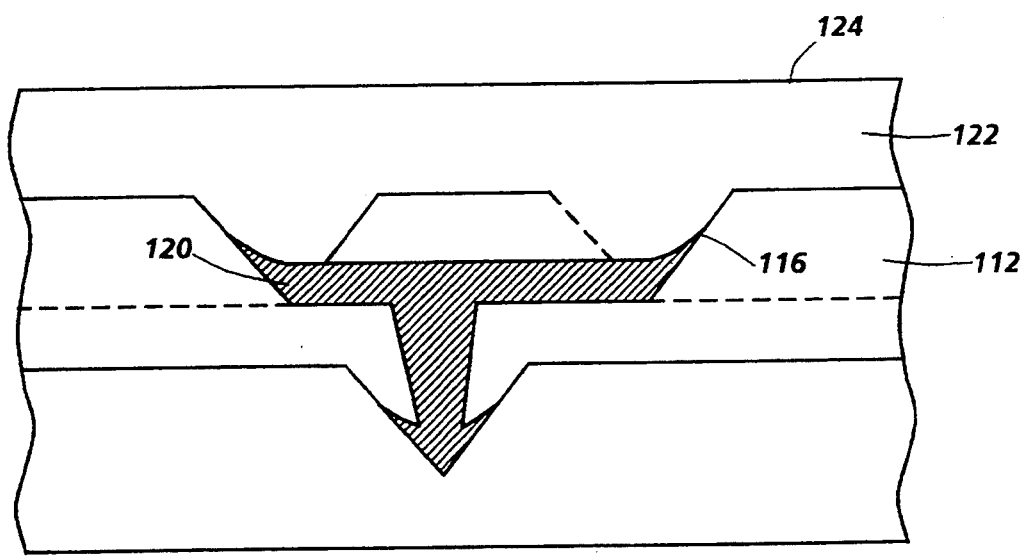
FIG. 10 is a schematic illustration of a cut-away side elevation of a vertical quantum wire semiconductor structure formed according to this invention.

Epitaxial growth is then continued, as shown in FIG. 10, with the growth of a semiconductor cladding layer 122 of $Al_yGa_{1-y}As$ which can either follow the contour of the previously deposited barrier layer 112 with its groove 116 and crescent shaped quantum wire 120 or, as shown in this Figure, provide a flat upper surface 124.

The horizontal quantum wires will be isolated from each other by the barrier layer except for the connecting hole where the vertical quantum wire connects the horizontal quantum wires.

The use of horizontal quantum wires in FIGS. 8 to 10 is for the purposes of example. The quantum wires to be connected can be oriented at any angle spatially relative to each other, even aligned as in FIG. 6.

Alternatively, the connecting hole 118 can be filled with a quantum well layer of a different semiconductor material to form the vertical quantum wire 122. The quantum well layer deposited in the groove 116 and over the filled in connecting hole 118 and photo induced desorbed to form quantum wire 120 would be the same material used to form quantum wire 110. This different semiconductor material for the connecting quantum wire would have a lower bandgap than the semiconductor material used to form the quantum wires 110 and 120. The lower bandgap would aid in current flow through the connecting vertical quantum wire between the horizontal quantum wires.

One alternative to having the high bandgap semiconductor material barrier layer is to have the quantum wire of doped material and the cladding layers and barrier layers of undoped or semi-insulating material. The initial cladding layer would be a layer of undoped or $p-Al_xGa_{1-x}As$. The quantum well layers and the resulting quantum wires would be a n-type doped quantum well layer comprising n-GaAs heavily doped, for example, with Si or Se at a concentration of $10^{19}/cm^3$. The barrier layers of undoped or $p-Al_xGa_{1-x}As$ would be grown on top of the quantum wire. The vertical quantum wire could be even more heavily doped or of a different material or a different dopant to aid in current flow through the connecting vertical quantum wire between the horizontal quantum wires.

The doping content of the quantum well layer is of opposing conductivity type to the adjacent undoped or semi-insulating cladding and barrier layers. Thus, the quantum wire and the cladding and barrier layers can be of the same material, for example AlGaAs, even though the bandgap would obviously be the same for both the wire and the cladding.

Alternatively, a semiconductor structure with a vertical quantum wire could be fabricated by rotating the semiconductor structure 12 in FIGS. 1 to 3 by 90 degrees, either before or after formation of the quantum wire. Horizontal and vertical quantum wires can be formed in the same semiconductor structure by rotating the structure depending upon whether horizontal or vertical quantum wires are to be fabricated. The ends of the quantum wires can be left open, not covered by the barrier or cladding layers, so that the quantum wires can be connected.

Vertical and horizontal quantum wires could be fabricated together and connected together for the purposes of circuitry or carrying electrical current. The processing techniques in U.S. patent application Ser. No. 07/257,498 permit the full in situ processing of a quantum wire without removal of the semiconductor structure from the MOCVD reactor or movement or masking of the structure in the reactor.

It naturally follows that multiple layers of horizontal, vertical and patterned multiple quantum wires can be combined in a myriad of ways obvious to those of skill in the art to form electronic circuitry or channels for current flow or to function as electronic waveguides. The quantum wire can be formed anywhere within a multi-layer semiconductor structure.

Although the foregoing discussion has been described in connection with semiconductors of GaAs and GaAlAs, other III–V alloys may be employed in the practice of this invention, such as InGaP, InGaAsP, GaAlAsP, InGaAlP, InGaAlAsP, InP or GaAlSb or II–VI materials, e.g., ZnSe, ZnSSe and CdS. Also, Group IV materials, most importantly Si and Ge, may be utilized as semiconductor layers or a multiple quantum well structure of alternating well layers of GaAs or $Al_zGa_{1-z}As$ and corresponding barrier layers of either AlAs or $Al_{z'}Ga_{1-z'}As$ where $x>y>z'>z$. In a multiple quantum wire semiconductor structure, different quantum wires can be of different quantum well semiconductor material depending upon circumstances and needs.

While the invention has been described in conjunction with specific embodiments, it is evident to those skilled in the art that many alternatives, modifications and variations will be apparent in light of the foregoing description. Accordingly, the invention is intended to embrace all such alternatives, modifications and variations as fall within the spirit and scope of the appended claims.

What is claimed is:

1. A method of forming a quantum wire in a semiconductor structure comprising the steps of:
    epitaxially depositing a quantum well layer on a semiconductor layer or substrate, said semiconductor layer or said substrate having a groove,
    interrupting the epitaxial growth after the deposition of said quantum well layer,
    selectively desorbing in situ, employing photo induced evaporation, portions of said quantum well layer in said groove to the interface with the layer therebeneath leaving a quantum wire in the vertex of said groove, and
    epitaxially depositing at least one semiconductor layer.

2. The method of forming a quantum wire in a semiconductor structure of claim 1 wherein said groove is V-shaped.

3. The method of forming a quantum wire in a semiconductor structure of claim 1 wherein said quantum well layer is of a low bandgap semiconductor material and said adjacent semiconductor layers or substrate are of a high bandgap semiconductor material.

4. The method of forming a quantum wire in a semiconductor structure of claim 1 wherein said quantum well layer is of a doped semiconductor material and said adjacent semiconductor layers or substrate are of an undoped, semi-insulating, or opposing conductivity type semiconductor material.

5. A method of forming a patterned quantum wire in a semiconductor structure comprising the steps of:
    forming a patterned groove in a semiconductor layer or a substrate,
    epitaxially depositing a quantum well layer on said semiconductor layer or said substrate,
    interrupting the epitaxial growth after the deposition of said quantum well layer, selectively desorbing in situ, employing photo induced evaporation, portions of said quantum well layer in said patterned groove to the interface with the layer therebeneath leaving a quantum wire in the vertex of said patterned groove, and epitaxially depositing at least one semiconductor layer.

6. The method of forming a patterned quantum wire in a semiconductor structure of claim 5 wherein said patterned groove is V-shaped.

7. The method of forming a patterned quantum wire in a semiconductor structure of claim 5 wherein said quantum well layer is of a low bandgap semiconductor material and said adjacent semiconductor layers or substrate are of a high bandgap semiconductor material.

8. The method of forming a patterned quantum wire in a semiconductor structure of claim 5 wherein said quantum well layer is of a doped semiconductor material and said adjacent semiconductor layers or substrate are of an undoped, semi-insulating, or opposing conductivity type semiconductor material.

9. A method of forming multiple quantum wires in a semiconductor structure comprising the steps of:

epitaxially depositing a quantum well layer on a semiconductor layer or a substrate, said semiconductor layer or said substrate having a series of grooves, interrupting the epitaxial growth after the deposition of said quantum well layer, selectively desorbing in situ, employing photo induced evaporation, portions of said quantum well layer in said grooves to the interface with the layer therebeneath leaving a quantum wire in the vertex of each of said series of grooves, and epitaxially depositing at least one semiconductor layer.

10. The method of forming multiple quantum wires in a semiconductor structure of claim 9 wherein said series of grooves are V-shaped.

11. The method of forming multiple quantum wire in a semiconductor structure of claim 7 wherein said quantum well layer is of a low bandgap semiconductor material and said adjacent semiconductor layers or substrate are of a high bandgap semiconductor material.

12. The method of forming multiple quantum wires in a semiconductor structure of claim 9 wherein said quantum well layer is of a doped semiconductor material and said adjacent semiconductor layers or substrate are of an undoped, semi-insulating, or opposing conductivity type semiconductor material.

13. A method of forming multiple quantum wires in a semiconductor structure comprising the steps of:

epitaxially depositing a quantum well layer on a semiconductor layer or a substrate, said semiconductor layer or said substrate having a groove, interrupting the epitaxial growth after the deposition of said quantum well layer, selectively desorbing in situ, employing photo induced evaporation, portions of said quantum well layer in said groove to the interface with the layer therebeneath leaving a quantum wire in the vertex of said groove, epitaxially depositing a barrier layer, forming a groove in said barrier layer, epitaxially depositing a quantum well layer on said barrier layer, interrupting the epitaxial growth after the deposition of said quantum well layer, selectively desorbing in situ, employing photo induced evaporation, portions of said quantum well layer in said groove in said barrier layer to the interface with the layer therebeneath leaving a quantum wire in the vertex of said groove, and epitaxially depositing at least one semiconductor layer.

14. The method of forming multiple quantum wires in a semiconductor structure of claim 13 further comprising the steps after forming a quantum wire in the vertex of said groove in said barrier layer of:

alternating epitaxially depositing a barrier layer, forming a groove in said barrier layer; depositing a quantum well layer on said barrier layer; and selectively desorbing in situ, employing photo induced evaporation, portions of said quantum well layer in said groove to the interface with the layer therebeneath leaving a quantum wire in the vertex of said groove.

15. The method of forming multiple quantum wires in a semiconductor structure of claim 14 wherein said groove in said semiconductor layer or said substrate is aligned with said grooves in said barrier layers.

16. The method of forming multiple quantum wires in a semiconductor structure of claim 14 wherein said groove in said semiconductor layer or said substrate is not aligned with said grooves in said barrier layers.

17. The method of forming multiple quantum wires in a semiconductor structure of claim 13 wherein said groove in said barrier layer is formed by said barrier layer following the contour of said semiconductor layer or said substrate.

18. The method of forming multiple quantum wires in a semiconductor structure of claim 13 wherein said groove in said barrier layer is fabricated after said barrier layer is epitaxially deposited.

19. The method of forming multiple quantum wires in a semiconductor structure of claim 13 wherein said groove in said semiconductor layer or said substrate is aligned with said groove in said barrier layer.

20. The method of forming multiple quantum wires in a semiconductor structure of claim 13 wherein said groove in said semiconductor layer or said substrate is not aligned with said groove in said barrier layer.

21. The method of forming multiple quantum wires in a semiconductor structure of claim 13 wherein said quantum well layer is of a low bandgap semiconductor material and said adjacent semiconductor layers or substrate and said barrier layer are of a high bandgap semiconductor material.

22. The method of forming multiple quantum wires in a semiconductor structure of claim 13 wherein said quantum well layer is of a doped semiconductor material and said-adjacent semiconductor layers or substrate and said barrier layer are of an undoped, semi-insulating, or opposing conductivity type semiconductor material.

23. A method of connecting multiple quantum wires in a semiconductor structure comprising the steps of:

epitaxially depositing a quantum well layer on a semiconductor layer or a substrate, said semiconductor layer or said substrate having a groove, interrupting the epitaxial growth after the deposition of said quantum well layer, selectively desorbing in situ, employing photo induced evaporation, portions of said quantum well layer in said groove to the interface with the layer therebeneath leaving a quantum wire in the vertex of said groove, epitaxially depositing a barrier layer, forming a groove in said barrier layer, fabricating a hole in said groove in said barrier layer to said quantum wire, epitaxially depositing a quantum well layer on said barrier layer and in said hole, interrupting the epitaxial growth after the deposition of said quantum well layer, selectively desorbing in situ, employing photo induced evaporation, portions of said quantum well layer in said groove in said barrier layer to the interface with the layer therebeneath leaving a quantum wire in the vertex of said groove and a quantum wire in said hole connecting said quantum wires in said grooves, and epitaxially depositing at least one semiconductor layer.

24. The method of connecting multiple quantum wires in a semiconductor structure of claim 23 wherein said groove in said semiconductor layer or said substrate is aligned with said groove in said barrier layer.

25. The method of connecting multiple quantum wires in a semiconductor structure of claim 23 wherein said groove in said semiconductor layer or said substrate is not aligned with said groove in said barrier layer.

26. The method of connecting multiple quantum wires in a semiconductor structure of claim 23 wherein said quantum well layers are of a low bandgap semiconductor material and said adjacent semiconductor layers or substrate and said barrier layer are of a high bandgap semiconductor material.

27. The method of connecting multiple quantum wires in a semiconductor structure of claim 23 wherein said step of epitaxially depositing a quantum well layer on said barrier layer and in said hole, comprises:

epitaxially depositing a quantum well layer in said hole, and epitaxially depositing a quantum well layer in said groove.

28. The method of connecting multiple quantum wires in a semiconductor structure of claim 27 wherein said quantum well layers in said grooves are of a low bandgap semiconductor material, said quantum well layer in said hole is of a lower bandgap semiconductor material than said quantum well layers in said grooves, and said adjacent semiconductor layers or substrate and said barrier layer are of a high bandgap semiconductor material.

29. The method of connecting multiple quantum wires in a semiconductor structure of claim 23 Wherein said quantum well layers are of a doped semiconductor material and said adjacent semiconductor layers or substrate and said barrier layer are of an undoped, semi-insulating, or opposing conductivity type semiconductor material.

* * * * *